US007345904B1

(12) United States Patent
Park et al.

(10) Patent No.: US 7,345,904 B1
(45) Date of Patent: Mar. 18, 2008

(54) METHOD FOR PROGRAMMING AN ELECTRONICALLY PROGRAMMABLE SEMICONDUCTOR FUSE

(75) Inventors: Byeongju Park, Plainview, NY (US); Deok-Kee Kim, Bedford Hills, NY (US); John M. Safran, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/548,477

(22) Filed: Oct. 11, 2006

(51) Int. Cl.
*G11C 17/18* (2006.01)
(52) U.S. Cl. ..................................... 365/96; 365/225.7
(58) Field of Classification Search .................. 365/96, 365/225.7; 257/50, 530
See application file for complete search history.

(56) References Cited

U.S. PATENT DOCUMENTS

| 6,624,499 | B2 | 9/2003 | Kothandaraman et al. |
| 2005/0189613 | A1 | 9/2005 | Otsuka et al. |
| 2005/0237841 | A1 | 10/2005 | Wu et al. |
| 2005/0286332 | A1 | 12/2005 | Uvieghara |
| 2006/0044049 | A1 | 3/2006 | Ouellette et al. |
| 2006/0087001 | A1 | 4/2006 | Kothandaraman et al. |
| 2006/0108662 | A1 | 5/2006 | Kothandaraman et al. |

OTHER PUBLICATIONS

C. Kothandaraman, et al., "Electrically Programmable Fuse (eFUSE) Using Electromigration in Silicides", Sep. 2002, IEEE Electron Device Letters, vol. 23 No. 9, pp. 523-525.*
J.R. Lloyd, "Electromigration for Designers: An Introduction for Non-Specialist", http://wwww.techonline.com/community/ed_resource/feature_article/20421, 10 pages, Apr. 12, 2002.

* cited by examiner

*Primary Examiner*—Derrick W. Ferris
*Assistant Examiner*—Harry W Byrne
(74) *Attorney, Agent, or Firm*—Kerry B. Goodwin

(57) ABSTRACT

A method for programming an electronically programmable semiconductor fuse applies a programming current to a fuse link as a series of multiple pulses. The fuse link has a nominal maximum programming current and corresponding combinations of a programming voltage and a gate voltage associated with the nominal maximum programming current. A first programming current pulse is generated to provide a programming current less than the maximum programming current. The first programming current pulse causes electromigration to increase the resistance of the fuse link. A subsequent programming current pulse is applied using a combination of gate voltage and programming voltages which if applied to the fuse link absent any electromigration would result in a programming current greater than the nominal maximum programming current. However, the resistance created by the first programming pulse reduces the programming current of the subsequent programming pulse to a level below the maximum programming current.

9 Claims, 4 Drawing Sheets

METHOD FOR PROGRAMMING AN ELECTRONICALLY PROGRAMMABLE SEMICONDUCTOR FUSE

CROSS REFERENCE TO RELATED APPLICATIONS

A non-provisional patent application entitled "Apparatus and Method for Programming an Electronically Programmable Semiconductor Fuse", Ser. No. 11/548,482, assigned to the same assignee as the present application and directed to generally related subject matter, is being submitted to the U.S. Patent and Trademark Office on the same day as the present application.

BACKGROUND OF THE INVENTION

The invention relates generally to electronically programmable semiconductor fuses, and more particularly to a method of programming an electronically programmable semiconductor fuse.

Programmable semiconductor fuse devices are known in the art. For example, with reference to FIGS. 1-5, and initially to FIGS. 1 and 2, U.S. Patent Application Publication Nos. 2006/0087001 (Kothandaraman et al., the "'001 reference") and 2006/0108662 (Kothandaraman et al., the "'662 reference"), both of which are assigned to the same assignee as the present application, disclose an electronically programmable semiconductor fuse assembly (or "eFuse") 10 including a first conductive area 12 and a second conductive area 14 coupled by a fuse link 16. The '001 reference and the '662 reference are incorporated herein by reference in their entirety. The first and second conductive areas 12 and 14, as well as the fuse link 16 are formed from a polysilicon layer 24 and a metallic silicide layer 26 deposited over an insulating layer 22. As discussed in the '001 reference, the polysilicon layer 24 preferably includes a dopant. The insulating layer 22 may be formed for example from silicon oxide. The insulating, polysilicon, and silicide layers 22, 24, and 26, respectively, are formed on a semiconductor substrate 20. A capping barrier layer (not shown) formed, for example, from silicon nitride, may be provided over the insulating, polysilicon, and metallic silicide layers 22, 24, 26, respectively. The first and second conductive areas 12 and 14 are provided with contacts 18. The contacts 18 are preferably formed from a metal such as tungsten.

An eFuse 10 programmed by an electromigration process changes from having a first resistance in an unprogrammed state to a second resistance, significantly higher than the first resistance, in a programmed state. To program the eFuse 10, a potential is applied across the fuse link 16 generating a programming current Ip and raising the temperature of the fuse link 16. The electromigration process is affected by both the resultant current density within the fuse link 16, as well as by the temperature generated as a result of Joule heating generated by the current flow within the fuse link 16. With application of sufficient programming current Ip, electromigration of metal within the silicide layer 26 occurs, with migration of the metal toward the anodic conductive area. Also, the dopant in the polysilicon layer 24 migrates toward the anodic conductive area. With migration of metal in the silicide layer 26 and of dopant in the polysilicon layer 24, the resistance of the fuse link 16 increases.

Programming an eFuse 10 requires providing a programming current Ip of sufficient magnitude to reliably cause the desired degree of electromigration within the fuse link 16. However, exceeding the desired level of programming current Ip can lead to excessive fuse link temperatures $T_{FL}$. Specifically, the fuse link 16 has a rupture temperature $T_R$ at which the fuse link 16 is physically ruptured. Such rupture (or uncontrolled explosion) of the fuse link 16 is undesirable as it can damage both the fuse link 16 as well as surrounding portions of the semiconductor device, rendering the eFuse 10 unsuitable for use. There is thus a relatively narrow range within which the programming current Ip is both sufficiently large to cause an effective level of electromigration and sufficiently small to avoid heating the fuse link 16 beyond the rupture temperature $T_R$.

The artisan will appreciate that variations inherent in the semiconductor manufacturing process can affect the range of acceptable programming current. For example, variations in the geometry or material composition of the fuse link 16 can decrease the range of acceptable programming current.

With reference now to FIG. 3, it is known to control the programming process of the programmable fuse 10 using a prior art current supply 40 comprising a programming field effect transistor (FET) 30 operatively coupled to control circuitry 32. The control circuitry 32 may include, for example, a pulse generator, one or more logic gates, or other conventional electrical components. The control circuitry 32 is used to generate a pulse of voltage delivered to the gate of the programming FET 30. The eFuse 10 designer selects set points for the programming FET gate voltage Vgs and programming voltage $V_{FS}$ corresponding to a programming current Ip within the desired range of programming currents. For example, it is known in the art to generate a voltage pulse Vgs, typically having a magnitude in the range of 1.5 to 3.3 V, for a duration typically about 200 microseconds, while simultaneously applying a programming voltage $V_{FS}$, typically in the range of 1.0 to 3.5 V.

With reference to FIG. 4, in one example of a prior art current supply 40, assuming application of a programming FET gate voltage Vgs of 2.0 V, in combination with a programming voltage $V_{FS}$ of 2.0 V, a programming current Ip of roughly 15 mA is generated.

With reference to FIG. 5, in an example of a known eFuse programming method, a programming current Ip of approximately 5 to 10 mA is applied as a single pulse for a duration of approximately 200 microseconds. The gate voltage may be set to a value Vgs max (along with a specified value of $V_{FS}$) to result in a theoretical nominal maximum programming current, Ip max (that is, the theoretical maximum programming current generating the desired degree of electromigration, without inducing a temperature in the fuse link 16 which exceeds the rupture temperature $T_R$). However, given variability in the characteristics of the eFuse 10 device (including both the current supply and the fuse link 16 itself), it is difficult to obtain a one hundred percent yield in the programming process. That is, some eFuse 10 devices programmed in the conventional manner will have either incomplete electromigration or will rupture due to excessive temperature.

A need exists, therefore, for a method of programming an electronically programmable fuse which allows the eFuse 10 to be reliably programmed while also avoiding application of excessive programming current and the consequent potential for exceeding the rupture temperature of the fuse link 16.

BRIEF SUMMARY OF THE INVENTION

Briefly stated, in a first aspect the invention is a method of programming an electronically programmable semiconductor fuse. The method comprises a step of providing a semiconductor fuse structure including a first conductive area and a second conductive area coupled by a fuse link. A current supply operatively coupled to the semiconductor fuse is provided, the current supply being capable of producing a gate voltage and a programming voltage. A programming current from the current supply is applied to the semiconductor fuse as series of multiple pulses. The fuse link has a nominal maximum programming current and, for a given programming voltage, a nominal maximum gate voltage associated with the nominal maximum programming current. A first programming current pulse is generated using a gate voltage which is less than the nominal maximum gate voltage. A subsequent programming current pulse is generated using a gate voltage which is greater than the nominal maximum gate voltage.

In a second aspect, the invention is a method of programming an electronically programmable semiconductor fuse. The method comprises a step of providing a semiconductor fuse structure including a first conductive area and a second conductive area coupled by a fuse link. A current supply operatively coupled to the semiconductor fuse is provided, the current supply being capable of producing a gate voltage and a programming voltage. A programming current from the current supply to the semiconductor fuse is applied as a series of multiple pulses. The fuse link has a nominal maximum programming current and, for a given gate voltage, a nominal maximum programming voltage associated with the nominal maximum programming current. A first programming current pulse is generated using a programming voltage which is less than the nominal maximum programming voltage. A subsequent programming current pulse is generated using a programming voltage which is greater than the nominal maximum programming voltage.

BRIEF DESCRIPTION OF THE SEVERAL VIEWS OF THE DRAWINGS

The following detailed description of preferred embodiments of the invention will be better understood when read in conjunction with the appended drawings. For the purpose of illustrating the invention, there is shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
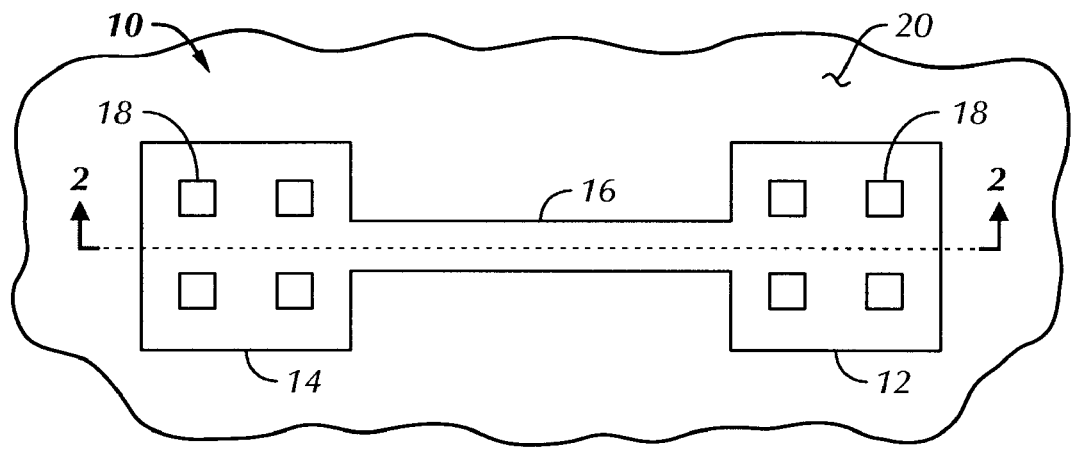
FIG. 1 is a top plan view of an electronically programmable semiconductor fuse device known in the prior art.
Figure 2:
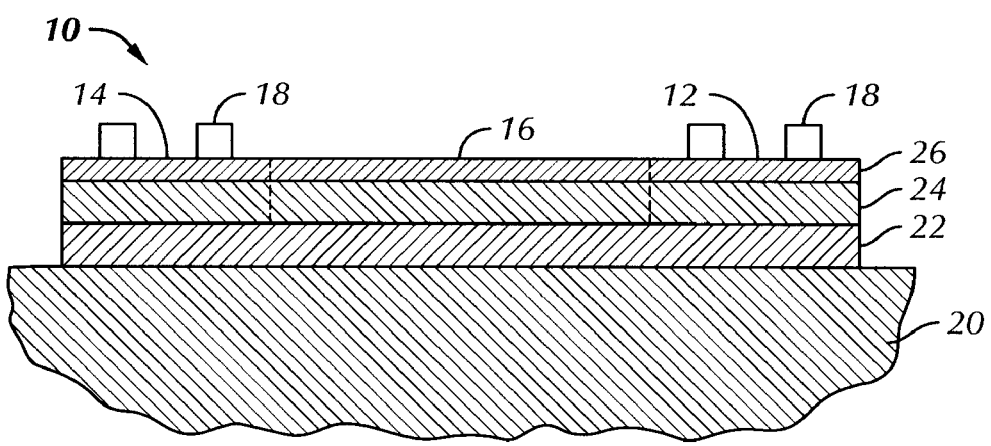
FIG. 2 is a cross-sectional view of the fuse device of FIG. 1, taken along line 2-2 of FIG. 1.
Figure 3:
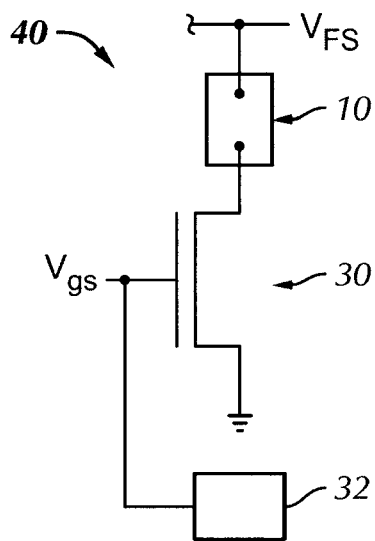
FIG. 3 is a schematic diagram of a known apparatus used to program the fuse device of FIG. 1.
Figure 4:
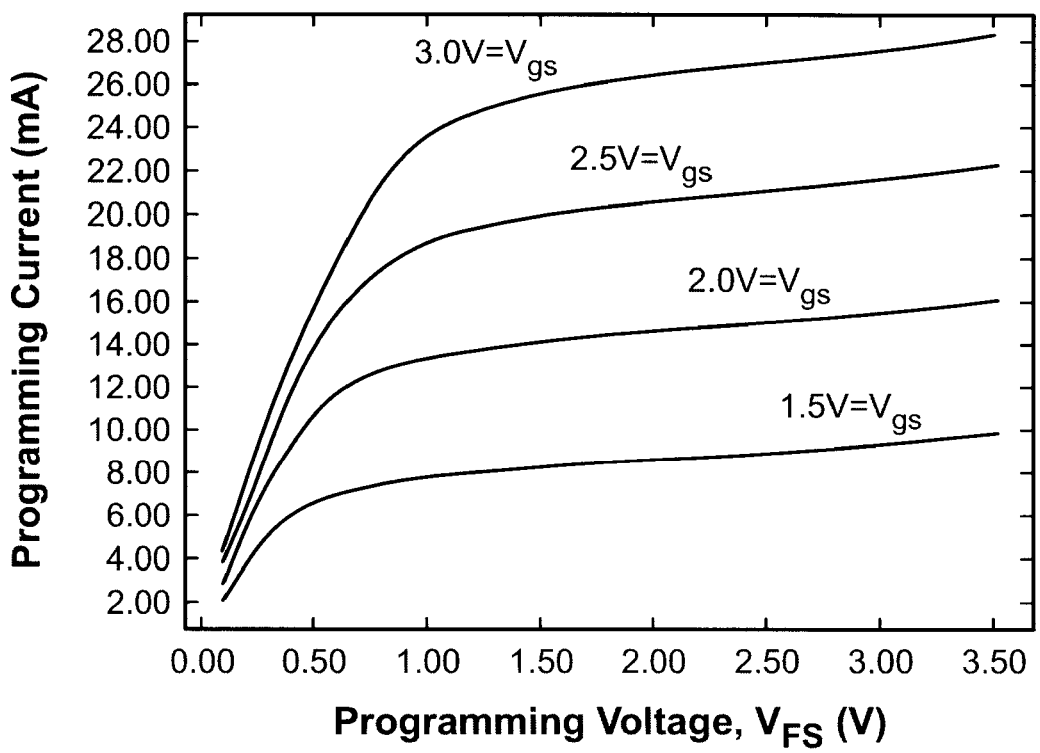
FIG. 4 is a graphical representation of variation of a programming current with a gate voltage and a programming voltage applied to a field effect transistor component of the known apparatus of FIG. 3.
Figure 5:
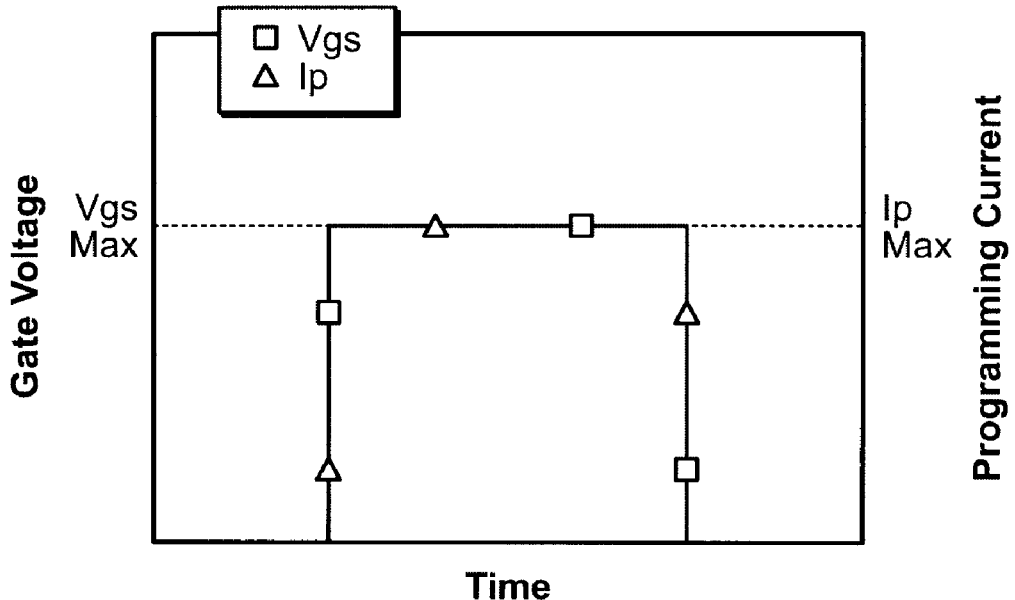
FIG. 5 is a schematic graphical representation of variation of gate voltage and a programming current with time using a known method of programming the fuse device of FIG. 1.

As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Figure 6:
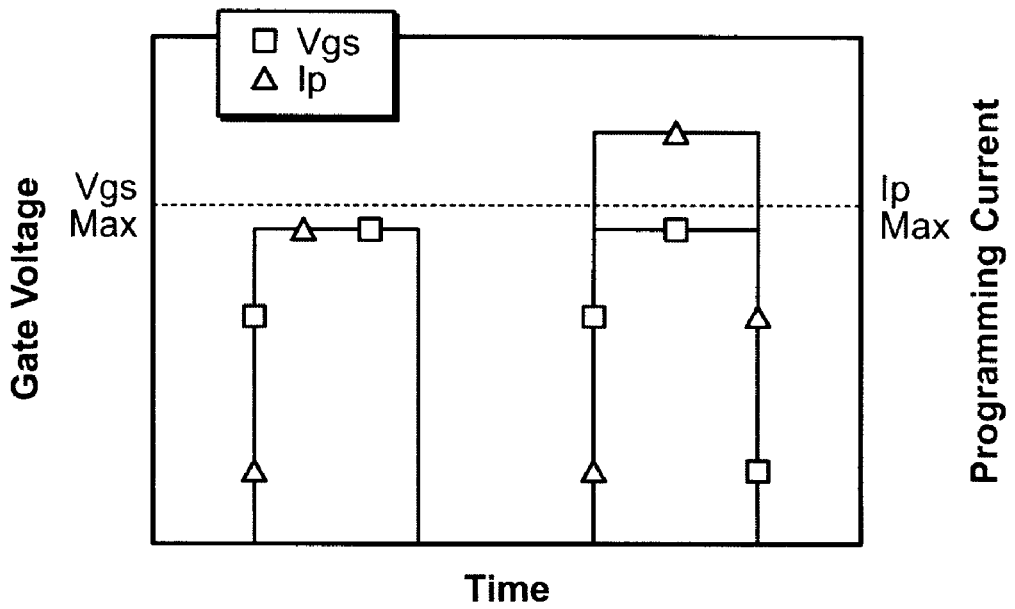
FIG. 6 is a schematic graphical representation of variation of gate voltage and programming current with time using a method of programming the fuse device of FIG. 1 in accordance the present invention.
Figure 7:
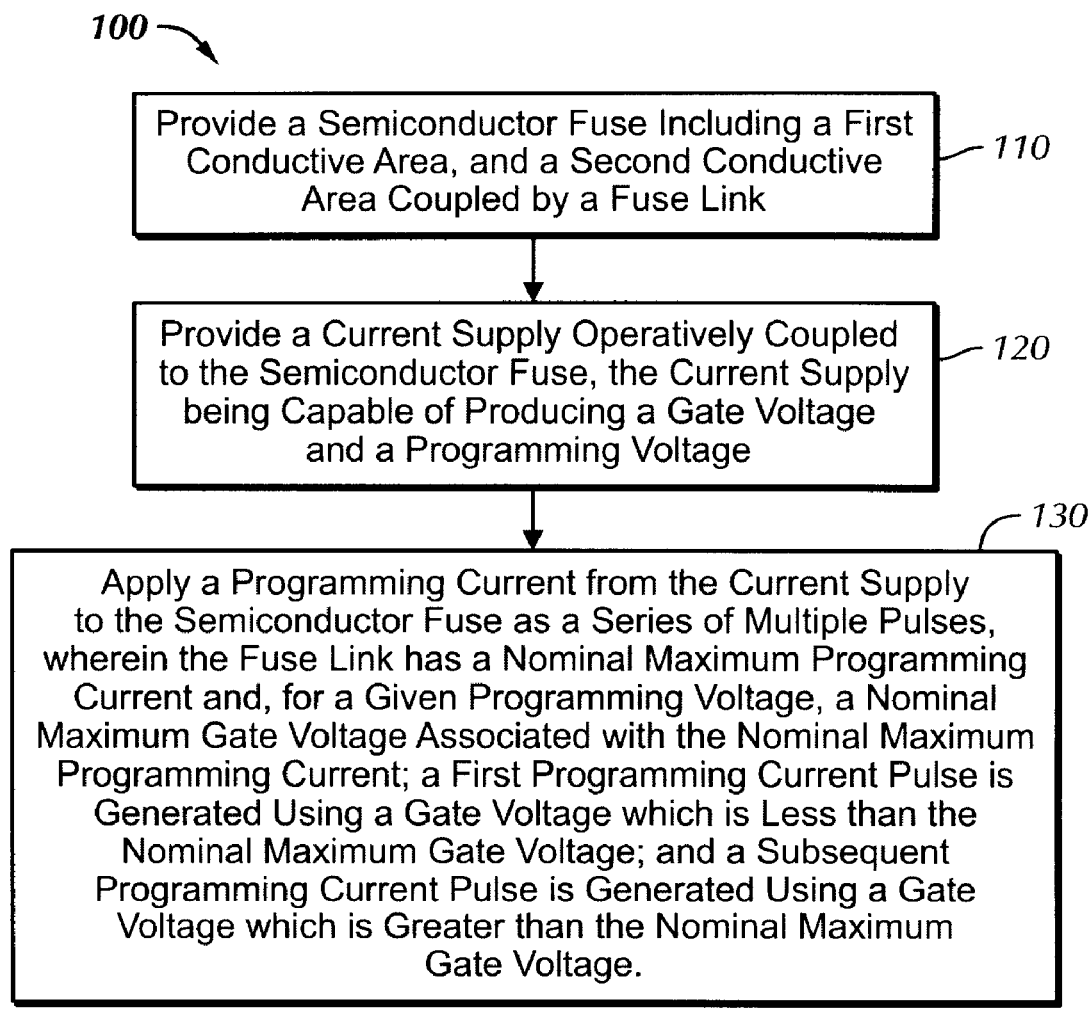
FIG. 7 is a diagram of steps of the method of programming the fuse device of FIG. 1 in accordance with the present invention.

Referring to FIGS. 6 and 7, there is shown a schematic graphical representation of variation of gate voltage Vgs and programming current Ip with time resulting from application of a method 100 of programming an eFuse 10, in accordance with a preferred embodiment of the present invention.

With particular reference to FIG. 7, the method 100 of programming the electronically programmable semiconductor fuse or eFuse 10 comprises a step 110 of providing a semiconductor fuse structure including first conductive area 12 and second conductive area 14 coupled by fuse link 16. In a step 120, a current supply 40 operatively coupled to the semiconductor fuse 10 is provided, wherein the current supply 40 is capable of producing a gate voltage Vgs and a programming voltage $V_{FS}$. In a step 130, a programming current Ip from the current supply 40 is applied to the semiconductor fuse 10 as series of multiple pulses.

With particular reference to FIG. 6, a first programming current Ip pulse having a magnitude less than the nominal maximum programming current Ip max of the eFuse 10 is generated by the current supply 40. The magnitude of the programming current Ip is preferably varied by controlling one of the gate voltage Vgs or the programming voltage $V_{FS}$. Alternatively, both gate voltage Vgs and programming voltage $V_{FS}$ could be varied to control the programming current Ip. Assuming control of gate voltage Vgs using a given programming voltage $V_{FS}$, a first gate voltage Vgs applied during the first pulse is less than the nominal gate voltage Vgs max corresponding to the nominal maximum programming current Ip max. A subsequent programming current pulse is generated using a second gate voltage Vgs which is greater than the nominal maximum gate voltage $V_{FS}$ max. If the second gate voltage Vgs (at the given programming voltage $V_{FS}$) were to be applied in the first programming current pulse, then the magnitude of the programming current Ip of the first pulse would exceed the nominal maximum programming current Ip nominal maximum, resulting in increased potential for rupture of the fuse link 16. However, programming current Ip of the second pulse is in fact less than the nominal maximum programming current Ip max. This is due to the fact that some electromigration occurs during the first pulse, increasing the resistance of the fuse link 16. Thus, application of the higher second gate voltage Vgs in the second pulse results in a lower programming current Ip than would otherwise occur, absent the increased resistance of the fuse link 16 resulting from application of the first pulse.

Alternatively, the programming current Ip could be controlled by varying the programming voltage $V_{FS}$ about a given gate voltage Vgs, with the same results as discussed above achieved above by varying the gate voltage Vgs about a given programming voltage $V_{FS}$.

Preferably, the duration of each of the multiple programming current pulses is about 200 microsecons or less. Preferably, the magnitude of the gate voltage Vgs used to generate the first programming pulse is at least 80 percent of the nominal maximum gate voltage Vgs max. Further preferably, the magnitude of the gate voltage used to generate the subsequent programming pulse is no more than 150 percent of the nominal maximum gate voltage.

Application of the method 100 results, on average, in higher programmed state resistance of the eFuse 10. In a sample of over 21,000 eFuses 10 programmed by the conventional single pulse method, the $\log_{10}$ of the median final resistance (in ohms) of the eFuse 10 was measured to be 4.551, with the lowest 0.5 percentile of the sample having a log10 final resistance of 3.207 and the minimum $\log_{10}$ final resistance of 2.887. In contrast, in a sample of over 12,000 eFuses 10 programmed by the method 100, the $\log_{10}$ of the median final resistance (also in ohms) of the eFuse 10 was measured to be 4.847, with the lowest 0.5 percentile of the sample having a $\log_{10}$ final resistance of 3.560 and a minimum $\log_{10}$ final resistance of 3.308.

The programming method 100 provide the benefits of more reliable (that is, consistently higher programmed state resistance) programming of eFuses 10, mitigating the effects of variation in fuse link 16 geometry and material properties. Additionally, the higher resistance distribution of the eFuses 10 programmed with method 100 results in greater current differences between programmed and unprogrammed eFuses 10, and thus the circuitry used to detect the current differences can be designed to be less sensitive than would be necessary for eFuses 10 programmed using conventional methods.

From the foregoing it can be seen that the present invention provides a method for programming an electronically programmable fuse providing improved programmed state resistance while also mitigating excessive temperature and fuse link rupture during the programming process.

It will be appreciated by those skilled in the art that changes could be made to the embodiments described above without departing from the broad inventive concept thereof. It is to be understood, therefore, that this invention is not limited to the particular embodiments disclosed, but it is intended to cover modifications within the spirit and scope of the present invention as defined by the appended claims.

What is claimed is:

1. A method of programming an electronically programmable semiconductor fuse, comprising steps of:
   providing a semiconductor fuse structure including a first conductive area and a second conductive area coupled by a fuse link;
   providing a current supply operatively coupled to the semiconductor fuse, the current supply being capable of producing a gate voltage and a programming voltage; and
   applying a programming current from the current supply to the semiconductor fuse as series of multiple pulses, wherein:
   the fuse link has a nominal maximum programming current and, for a given programming voltage, a nominal maximum gate voltage associated with the nominal maximum programming current;
   a first programming current pulse is generated using a gate voltage which is less than the nominal maximum gate voltage; and
   a subsequent programming current pulse is generated using a gate voltage which is greater than the nominal maximum gate voltage.

2. The method of programming an electronically programmable semiconductor fuse of claim 1, wherein the gate voltage used to generate the subsequent programming current pulse is at least 0.35 volts greater than the gate voltage used to generate the first programming pulse.

3. The method of programming an electronically programmable semiconductor fuse of claim 1, wherein each of the multiple programming current pulses has a duration of about 200 microseconds or less.

4. The method of programming an electronically programmable semiconductor fuse of claim 1, wherein the magnitude of the gate voltage used to generate the first programming current pulse is at least 80 percent of the nominal maximum gate voltage.

5. The method of programming an electronically programmable semiconductor fuse of claim 1, wherein the magnitude of the gate voltage used to generate the subsequent programming current pulse is no more than 150 percent of the nominal maximum gate voltage.

6. A method of programming an electronically programmable semiconductor fuse, comprising steps of:
   providing a semiconductor fuse structure including a first conductive area and a second conductive area coupled by a fuse link;
   providing a current supply operatively coupled to the semiconductor fuse, the current supply capable of producing a gate voltage and a programming voltage; and
   applying a programming current from the current supply to the semiconductor fuse as series of multiple pulses, wherein:
   the fuse link has a nominal maximum programming current and, for a given gate voltage, a nominal maximum programming voltage associated with the nominal maximum programming current;
   a first programming current pulse is generated using a programming voltage which is less than the nominal maximum programming voltage; and
   a subsequent programming current pulse is generated using a programming voltage which is greater than the nominal maximum programming voltage.

7. The method of programming an electronically programmable semiconductor fuse of claim 6, wherein each of the multiple programming current pulses has a duration of about 200 microseconds or less.

8. The method of programming an electronically programmable semiconductor fuse of claim 6, wherein the magnitude of the programming voltage used to generate the first programming current pulse is at least 80 percent of the nominal maximum programming voltage.

9. The method of programming an electronically programmable semiconductor fuse of claim 6, wherein the magnitude of the programming voltage used to generate the subsequent programming current pulse is no more than 150 percent of the nominal maximum programming voltage.

* * * * *